United States Patent
Kim et al.

(10) Patent No.: US 9,412,326 B2
(45) Date of Patent: Aug. 9, 2016

(54) DISPLAY SUBSTRATE AND DISPLAY APPARATUS HAVING THE DISPLAY SUBSTRATE

(71) Applicant: Samsung Display Co., LTD., Yongin, Gyeonggi-Do (KR)

(72) Inventors: Luck-Hyun Kim, Suwon-si (KR); Ji-Hyun Kwon, Asan-si (KR); Sang-Moon Moh, Hwaseong-si (KR); Yeun-Mo Yeon, Asan-si (KR); Hyun-Seok Hong, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/510,429

(22) Filed: Oct. 9, 2014

(65) Prior Publication Data

US 2015/0145847 A1    May 28, 2015

(30) Foreign Application Priority Data

Nov. 22, 2013  (KR) ........................ 10-2013-0143280

(51) Int. Cl.
  *H01L 27/12*    (2006.01)
  *G09G 3/36*    (2006.01)
  *H01L 33/36*    (2010.01)
  *H01L 27/15*    (2006.01)

(52) U.S. Cl.
  CPC .............. *G09G 3/3688* (2013.01); *H01L 27/15* (2013.01); *H01L 33/36* (2013.01); *G09G 2300/0426* (2013.01); *G09G 2320/0223* (2013.01); *H01L 27/124* (2013.01)

(58) Field of Classification Search
  CPC ....... H01L 27/15; H01L 27/124; H01L 33/36; G09G 3/3688
  See application file for complete search history.

(56) References Cited

U.S. PATENT DOCUMENTS

| 2010/0295832 A1 | 11/2010 | Nishio et al. |
| 2011/0057968 A1 | 3/2011 | Kim et al. |
| 2013/0181966 A1 | 7/2013 | Jeong et al. |

FOREIGN PATENT DOCUMENTS

| JP | 2012058533 A | 3/2012 |
| KR | 1020060004255 A | 1/2006 |
| KR | 1020060055873 A | 5/2006 |
| KR | 1020060088221 A | 8/2006 |
| KR | 101195688 B1 | 10/2012 |
| KR | 1020130083722 A | 7/2013 |
| WO | 2010018759 A1 | 2/2010 |

*Primary Examiner* — Amar Movva
(74) *Attorney, Agent, or Firm* — Cantor Colburn LLP

(57) ABSTRACT

A display substrate includes a pixel electrode disposed in a display area, a first pad part disposed in a first area of a peripheral area which is disposed adjacent to the display area, where the first pad part is electrically connected to a driver circuit, a second pad part disposed in a second area of the peripheral area facing the first pad part, where the second pad part is electrically connected to a flexible circuit film which transfers a transmission signal to the driver circuit, and a connection line part disposed in an area between the first and second pad parts as a vertical line type, where the connection line part connects the first and second pad parts to each other.

20 Claims, 6 Drawing Sheets

DISPLAY SUBSTRATE AND DISPLAY APPARATUS HAVING THE DISPLAY SUBSTRATE

This application claims priority to Korean Patent Application No. 10-2013-0143280 filed on Nov. 22, 2013, and all the benefits accruing therefrom under 35 U.S.C. §119, the content of which is herein incorporated by reference in its entireties.

BACKGROUND

1. Field

Exemplary embodiments of the invention relate to a display substrate and a display apparatus having the display substrate. More particularly, exemplary embodiments of the invention relate to a display substrate with improved signal integrity and a display apparatus including the display substrate.

2. Description of the Related Art

In general, a liquid crystal display ("LCD") apparatus includes an LCD panel and a plurality of driver circuits which drives the LCD panel.

The LCD panel includes a display area and a peripheral area. A plurality of gate lines, a plurality of data lines and a plurality of pixels are disposed in the display area. The driver circuits are typically disposed in the peripheral area. The driver circuits may include a gate driver circuit which drives the gate lines and a data driver circuit which drives the data lines.

A plurality of pads connected to a plurality of bumps of the driver circuit and a plurality of signal lines connected to the pads are disposed in the peripheral area.

Signals transferred through the signal lines may include a noise that may occur by line resistance and interference between signals transferred through adjacent signal lines.

SUMMARY

Exemplary embodiments of the invention provide a display substrate including signal lines configured to reduce noise in signals transferred therethrough.

Exemplary embodiments of the invention provide a display apparatus including the display substrate.

According to an exemplary embodiment of the invention, a display substrate includes a pixel electrode disposed in a display area, a first pad part disposed in a first area of a peripheral area which is disposed adjacent to the display area, where the first pad part is electrically connected to a driver circuit, a second pad part disposed in a second area of the peripheral area facing the first pad part, where the second pad part is electrically connected to a flexible circuit film which transfers a transmission signal to the driver circuit, and a connection line part disposed in an area between the first and second pad parts as a vertical line type, where the connection line part connects the first and second pad parts to each other.

In an exemplary embodiment, the first pad part may include a plurality of first pads, each of the first pads may include a first unit pad, an input bump of the driver circuit may be electrically connected to the first unit pad, the second pad part may include a plurality of second pads, each of the second pads may include a second unit pad, and an output bump of the flexible circuit film may be electrically connected to the second unit pad.

In an exemplary embodiment, first unit pads of the first pads may be arranged at a regular distance from each other and have a size substantially the same as each other, second unit pads of the second pads may be arranged at a regular distance and have a substantially same size as each other, and the regular distance and the size of the second unit pads of the second pads may be greater than the regular distance and the size of the first unit pads of the second pads.

In an exemplary embodiment, the connection line part may include a plurality of connection lines which connects the first pads and the second pads and is configured as the vertical line type.

In an exemplary embodiment, each of the connection lines may connect a first pad among the first pads and a second pad among the second pads corresponding to each other, where the second unit pad of the second pad is disposed on a vertical line from the first unit pad of the first pad connected to the second pad.

In an exemplary embodiment, the second pad part may further include a dummy unit pad which is disposed between the second pads and is electrically floated.

In an exemplary embodiment, a number of the second unit pad in a second pad of the second pads may be determined by a current amount of the transmission signal applied to the second pad, and when the current amount of the transmission signal applied to the second pad is increased, the number of the second unit pad in the second pad may be increased.

In an exemplary embodiment, the connection lines which transfer a same transmission signal have different resistances from each other, and numbers of the second unit pad in the second pads connected to the connection lines which transfer a same transmission signal may be different from each other.

In an exemplary embodiment, the connection lines which transfer a same transmission signal have a substantially same resistance, and numbers of the second unit pad in the second pads connected to the connection lines which transfer a same transmission signal may be the same as each other.

In an exemplary embodiment, a connection line configured to transfer a reference power signal for driving the pixel electrode among the connection lines may be configured as the vertical line type.

In an exemplary embodiment, a connection line configured to transfer an image data signal for driving the pixel electrode among the connection lines may be configured as the vertical line type.

In an exemplary embodiment, the connection lines may have an edge portion which is gradually sloped.

According to an exemplary embodiment of the invention, a display apparatus includes a display panel including a display area, a peripheral area which surrounds the display area, and a plurality of pixels which is disposed in the display area, a driver circuit connected to a first pad part of the display panel, which is disposed in a first area of the peripheral area, through an anisotropic conductive film ("ACF"), where the driver circuit is configured to provide the pixels with data voltages, a flexible circuit film connected to a second pad part of the display panel, which is disposed in a second area facing the first area of the peripheral area, through the ACF, where the flexible circuit film is configured to transfer a transmission signal to the driver circuit, and a connection line part disposed in an area between the first and second pad parts as a vertical line type, where the connection line part connects the first and second pad parts to each other.

In an exemplary embodiment, a number of the driver circuit connected to the first pad part may be equal to or greater than two.

In an exemplary embodiment, the first pad part may include a plurality of first pads, each of the first pads may include a first unit pad, an input bump of the driver circuit is electrically connected to the first unit pad, the second pad part may include a plurality of second pads, each of the second pads may include a second unit pad, an output bump of the flexible circuit film is electrically connected to the second unit pad, and the connection line part may include a plurality of connection lines which connects the first and second pads.

In an exemplary embodiment, the second pad part may further include a dummy unit pad which is disposed between the second pads and is electrically floated.

In an exemplary embodiment, a number of the second unit pad in a second pad of the second pads may be determined by a current amount of the transmission signal applied to the second pad, and when the current amount of the transmission signal applied to the second pad is increased, the number of the second unit pad in the second pad may be increased.

In an exemplary embodiment, the connection lines which transfer a same transmission signal have a substantially same resistance, and numbers of the second unit pad in the second pads connected to the connection lines which transfer the same transmission signal are the same as each other.

In an exemplary embodiment, a connection line configured to transfer a reference power signal for driving the pixel part among the connection lines may be configured as the vertical line type.

In an exemplary embodiment, a connection line configured to transfer an image data signal for driving the pixel part among the connection lines may be configured as the vertical line type.

According to exemplary embodiments of the invention, as described herein, the connection line part is configured as the vertical line type, and thus a line length of the connection line part may be decreased and a line width of the connection line part may be increased. Therefore, the connection line part may have a low resistance. In such embodiments, the number of the second unit pad in the second pad may be adjusted based on the current amount of the transmission signal such that the delay of the transmission signal may be decreased. In such embodiments, the number of the second unit pad may be adjusted such that the connection line for transferring the same transmission signal may be designed to have a substantially same or equivalent resistance. Thus, a delay difference between same transmission signals transferred through the connection lines may be decreased, and signal integrity and display quality are thereby improved.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
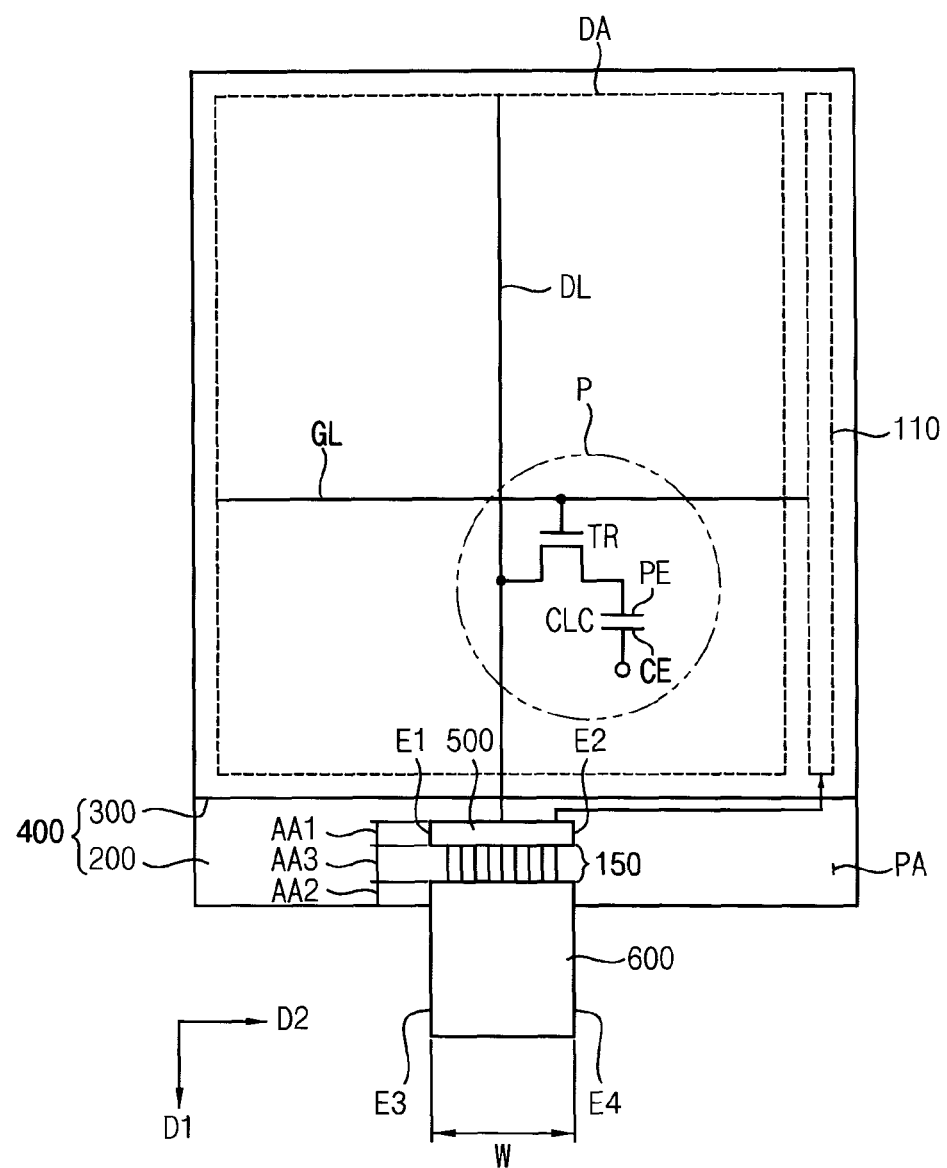
FIG. 1 is a plan view illustrating an exemplary embodiment of a display apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, the invention will be explained in detail with reference to the accompanying drawings.

Figure 2:
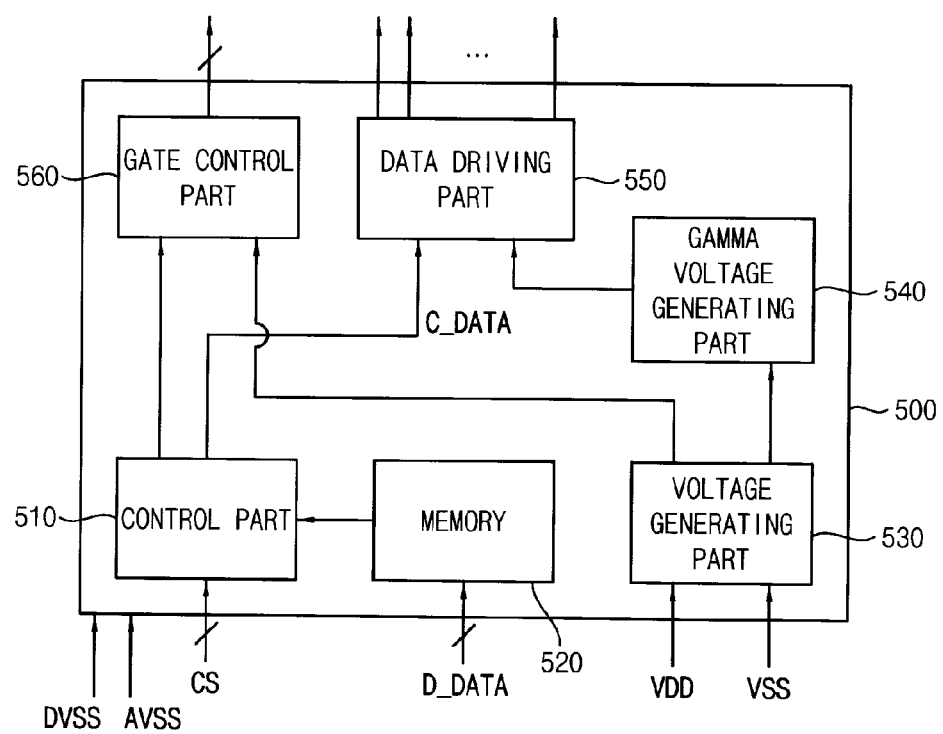
FIG. 2 is a block diagram illustrating an exemplary embodiment of a driver circuit of the display apparatus of FIG. 1.

FIG. 1 is a plan view illustrating an exemplary embodiment of a display apparatus according to the invention. FIG. 2 is a block diagram illustrating an exemplary embodiment of a driver circuit of the display apparatus of FIG. 1.

Referring to FIGS. 1 and 2, an exemplary embodiment of the display apparatus may include a display panel 400, a driver circuit 500 and a flexible circuit film 600 which connects the display panel 400 and the driver circuit 500.

The display panel 400 includes a display area DA and a peripheral area PA. The display panel 400 includes a display substrate 200, an opposing substrate 300 and a liquid crystal layer between the display and opposing substrates 200 and 300.

A plurality of pixels P is disposed in the display area DA and displays an image.

The driver circuit 500, the flexible circuit film 600 and a gate driver circuit 110 are disposed in the peripheral area PA surrounding the display area DA.

The display substrate 200 includes a plurality of data lines DL, a plurality of gate lines GL, a plurality of switching elements TR connected to the data and gate lines DL and GL, and a plurality of pixel electrodes PE connected to the switching elements TR.

The opposing substrate 300 includes a common electrode CE opposite to the pixel electrodes PE and may further include a plurality of color filters. The common electrode CE and the pixel electrode PE may define a liquid crystal capacitor CLC.

The data lines DL, the gate lines GL, the switching elements TR and the pixel electrodes PE are disposed in the display area DA of the display substrate 200.

The data lines DL extend substantially in a first direction D1 and are arranged in a second direction D2 crossing the first direction D1.

The gate lines GL extend substantially in the second direction D2 and are arranged in the first direction D1.

The switching elements TR are connected to the data lines DL and the gate lines GL and disposed in an area adjacent to a crossing area in which the data line DL overlaps the gate line GL.

The pixel electrodes PE are respectively connected to the switching elements TR. Each of the pixel electrodes PE defines a transmission area of a pixel P and receives a data signal transferred from the data line DL through the switching element TR.

The driver circuit 500, the flexible circuit film 600, a connection line part 150 and the gate driver circuit 110 are disposed in the peripheral area PA of the display substrate 200.

In an exemplary embodiment, the driver circuit 500 is disposed in a first area AA1 adjacent to an end portion of the data line DL. The driver circuit 500 may be provided or formed as a chip type, e.g., integrated circuit ("IC") chip.

In an exemplary embodiment, the flexible circuit film 600 is disposed in a second area AA2 which is spaced apart from the first area AA1, in which the driver circuit 500 is disposed, in the first direction D1.

In an exemplary embodiment, the flexible circuit film 600 has a width which is substantially the same as a width W of the driver circuit 500 in the second direction D2.

In one exemplary embodiment, for example, a first end (or side) portion E3 of the flexible circuit film 600 may be disposed on a vertical line extending from a first end portion E1 of the driver circuit 500, and a second end portion E4 of the flexible circuit film 600 may be disposed on a vertical line extending from a second end portion E2 of the driver circuit 500.

In an exemplary embodiment, the connection line part 150 is disposed in a third area AA3 between the first area AA1 including the driver circuit 500 and the second area AA2 including the flexible circuit film 600. The connection line part 150 includes a plurality of connection lines which electrically connects the driver circuit 500 and the flexible circuit film 600 to each other.

In such an embodiment, the connection lines of the connection line part 150 disposed in an area between the driver circuit 500 and the flexible circuit film 600, e.g., a vertical spacing area corresponding to the width W of the driver circuit 500 and the flexible circuit film 600, as a vertical line type. Herein, the vertical line type means having a vertical line shape extending substantially vertically with respect to opposing sides of the driver circuit 500 and the flexible circuit film 600.

The gate driver circuit 110 is disposed in the peripheral area PA adjacent to an end portion of the gate line GL. The gate driver circuit 110 may be directly provided or formed in the peripheral area PA via processes substantially the same as processes for providing the switching element TR. Alternatively, the gate driver circuit 110 may be provided or formed as the chip type.

The gate driver circuit 110 generates a gate signal based on a gate control signal provided from the driver circuit 500 and provides the gate line GL with the gate signal.

Referring to FIG. 2, in an exemplary embodiment, the driver circuit 500 includes a control part 510, a memory 520, voltage generating part 530, a gamma voltage generating part 540, a data driving part 550 and a gate control part 560.

The control part 510 receives an original control signal CS from an external device (not shown). The control part 510 controls the memory 520, the voltage generating part 530, the gamma voltage generating part 540, the data driving part 550 and the gate control part 560 based on the original control signal CS.

The memory 520 receives display data D_DATA from an external device (not shown). The display data D_DATA are written in the memory 520 and readout from the memory 520 based on a control of the control part 510.

The control part 510 corrects the display data D_DATA readout from the memory 520 utilizing a compensation algorithm, and then provides the data driving part 550 with corrected data C_DATA.

The voltage generating part 530 receives high and low power signals VDD and VSS from an external device (not shown), and generates a plurality of driving voltages utilizing the high and low power signals VDD and VSS. The driving voltages may include a plurality of reference gamma voltages which is applied to the gamma voltage generating part 540 and a plurality of gate driving voltages which is applied to the gate driving part 560.

The gamma voltage generating part 540 generates a plurality of gamma voltages utilizing the reference gamma voltages and provides the data driving part 550 with the gamma voltages.

The data driving part 550 converters the corrected data C_DATA into a data voltage utilizing the gamma voltages and provides the data line DL with the data voltage.

The gate control part 560 generates the gate control signal utilizing the gate driving voltages, and provides the gate driver circuit 110 with the gate control signal.

As described above, in an exemplary embodiment, the driver circuit 500 receives a plurality of transmission signals from an external system or device through the flexible circuit film 600. The transmission signals may include the original control signal CS, the display data D_DATA and the reference power signals VDD and VSS. The transmission signals may further include a plurality of power signals DVSS and AVSS to drive the driver circuit 500.

The display data D_DATA and the high and low power signals VDD and VSS are signals directly related to an image to be displayed on the display panel 400.

The display data D_DATA are grayscale data of the image and the high and low power signals VDD and VSS are reference voltages, which are utilized to convert the grayscale data into the data voltage. Therefore, in a display apparatus, when the display data D_DATA and the high and low power signals VDD and VSS are delayed or skewed, display quality may be decreased.

In an exemplary embodiment, the connection line part 150, which connects the driver circuit 500 and the flexible circuit film 600, may have a low-resistance and a substantially uniform or equivalent resistance such that an input signal of the driver circuit 500 may be effectively prevented from being delayed and skewed.

Figure 3:
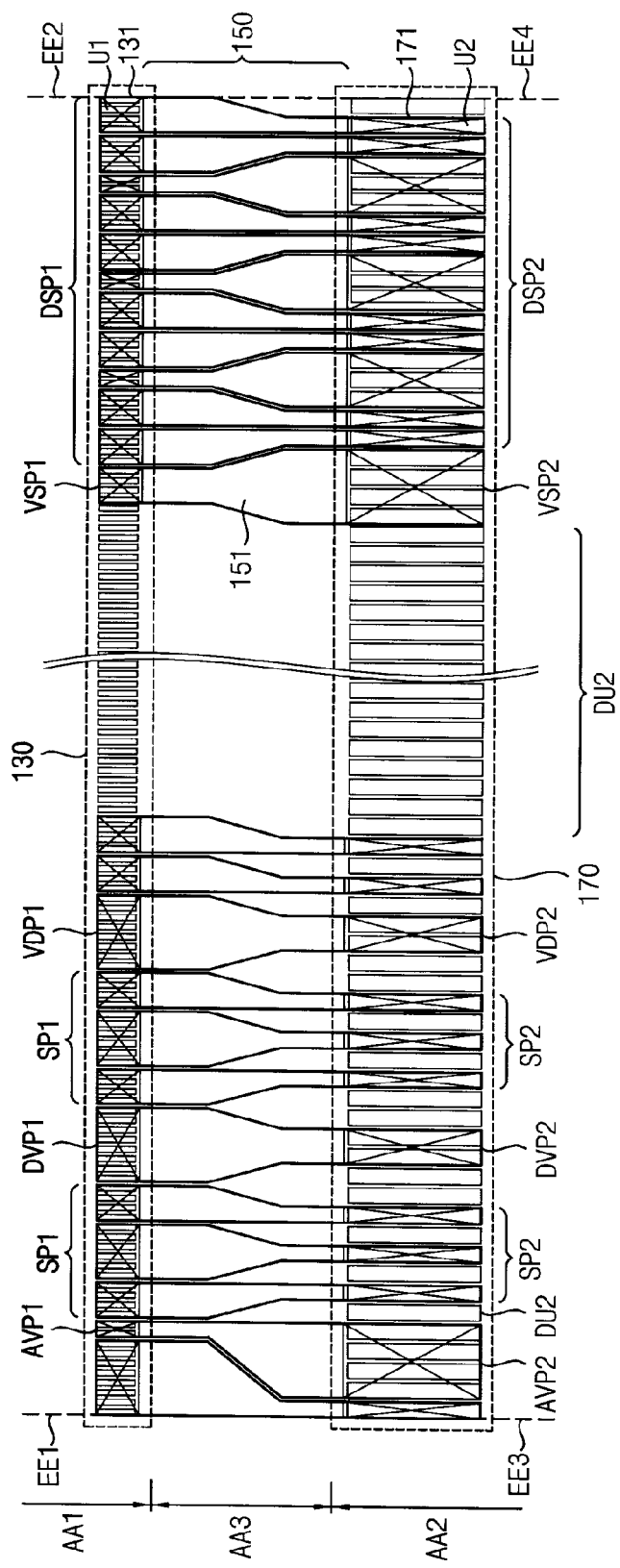
FIG. 3 is a plan view illustrating an exemplary embodiment of a peripheral area of the display apparatus of FIG. 1.

FIG. 3 is a plan view illustrating an exemplary embodiment of a peripheral area of the display apparatus of FIG. 1.

Referring to FIGS. 1 to 3, the peripheral area PA of the display substrate 200 includes the first area AA1, in which the driver circuit 500 is disposed, the second area AA2, in which the flexible circuit film 600 is disposed, and the third area AA3, in which the connection line part 150 is disposed.

In such an embodiment, a first pad part 130, which is electrically connected to the driver circuit 500, is disposed in the first area AA1. The first pad part 130 includes a plurality of first unit pads U1 which is electrically connected to a plurality of input bumps of the driver circuit 500 through an anisotropic conductive film ("ACF"). The first unit pads U1 may be arranged at a substantially constant or regular distance from each other and have a predetermined configuration, e.g., a same size or shape as each other.

The first pad part 130 includes a plurality of first pads 131 which includes a first unit pad U1, e.g., one or more first unit pads U1. Each of the first pads 131 receives corresponding transmission signal.

In an exemplary embodiment, the first pad part 130 includes a first edge portion EE1 which overlaps a first edge portion E1 of the driver circuit 500 and a second edge portion EE2 which overlaps a second edge portion E2 of the driver circuit 500. In such an embodiment, the first unit pads U1 may be disposed along from the first edge portion EE1 to the second edge portion EE2.

In one exemplary embodiment, for example, the first pad part 130 includes a first analog power pad AVP1 which receives an analog power signal AVSS, a first digital power pad DVP1 which receives a digital power signal DVSS, a first control signal pad SP1 which receives an original control signal CS, a first high power pad VDP1 which receives a high power signal VDD, a first low power pad VSP1 which receives a low power signal VSS and a first data pad DSP1 which receives display data D_DATA.

A second pad part 170 is disposed in the second area AA2 and is electrically connected to the flexible circuit film 600. The second pad part 170 faces to the first pad part 130.

The second pad part 170 includes a plurality of second unit pads U2 which is electrically connected to a plurality of output bumps of the flexible circuit film 600 through an ACF. The second unit pads U2 are arranged at a substantially constant or regular distance from each other in the second direction D2 and have a predetermined configuration, e.g., a size or shape substantially the same as each other. In an exemplary embodiment, the regular distance between and the size of the second unit pads U2 may be greater than the regular distance between and the size of the first unit pads U1, respectively.

The second pad part 170 includes a plurality of second pads 171 which includes a second unit pad U2. Each of the second pads 171 receives corresponding transmission signal.

In an exemplary embodiment, the second pad part 170 includes a first edge portion EE3 which overlaps a first edge portion E3 of the flexible circuit film 600 and a second edge portion EE4 which overlaps a second edge portion E4 of the flexible circuit film 600. The second unit pads U2 may be disposed along from the first edge portion EE3 to the second edge portion EE4.

In such an embodiment, as shown in FIG. 3, the first edge portion EE3 of the second pad part 170 may be disposed on a vertical line extending from the first end portion EE1 of the first pad part 130, and the second edge portion EE4 of the second pad part 170 the first pad part 130 may be disposed on a vertical line extending from the second end portion EE2 of the first pad part 130.

In one exemplary embodiment, for example, the second pad part 170 includes a second analog power pad AVP2 which outputs the analog power signal AVSS, a second digital power pad DVP2 which outputs the digital power signal DVSS, a second control signal pad SP2 which outputs the original control signal CS, a second high power pad VDP2 which outputs the high power signal VDD, a second low power pad VSP2 which outputs the low power signal VSS and a second data pad DSP2 which outputs the display data D_DATA.

The connection line part 150 is disposed in the third area AA3. The connection line part 150 is disposed in an area (also referred to as a vertical spacing area) between the first and second pad parts 130 and 170. The connection line part 150 may be directly formed in the third area AA3 of the display substrate 200 utilizing a metal layer substantially the same as a metal layer used to provide the data line DL or the gate line GL, via processes substantially the same as processes for providing the data line DL or the gate line GL.

The connection line part 150 includes a plurality of connection lines 151, 152, 153 and 154 (shown in FIGS. 3 and 4) which connects the first pads 131 and the second pads 171. In an exemplary embodiment, each of the connection lines 151, 152, 153 and 154 connects the first pad 131 and the second pad 171 as a vertical line type. In such an embodiment, each of the connection lines 151, 152, 153 and 154 may connect a first pad 131 to a second pad 171 corresponding to each other, where the second pad includes the second unit pad U2 disposed on a vertical line extending from a first unit pad U1 of the first pad 131 corresponding thereto. Thus, in such an embodiment, each of the connection lines 151, 152, 153 and 154 is configured as the vertical line type.

In one exemplary embodiment, for example, the second data pad DSP2 is configured to include the second unit pad U2 disposed on a vertical line extending from a first unit pad U1 of the first pad 131, and thus a connection line, e.g., a first connection line 151 which connects the first data pad DSP1 and the first data pad DSP1, is configured as the vertical line type having a vertical section.

As described above, in an exemplary embodiment, the connection line part 150 is disposed in the vertical spacing area between the first pad part 130 and the second pad part 170 as the vertical line type such that the connection line part 150 may have a short length and thick width. Thus, in such an embodiment, the connection line part 150 may have a low resistance.

In such an embodiment, the connection line part 150 includes the connection lines 151 configured as the vertical line type, and thus the second pad part 170 includes a dummy unit pad DU2. The dummy unit pad DU2 is disposed between the second pads 171 and is electrically floated as an island type.

In such an embodiment, the connection lines 151 of the connection line part 150 may be selectively in the vertical line type based on a forming area, a design margin and so on. However, in an exemplary embodiment, where the forming area is not sufficient, a predetermined portion of the connection lines 151, 152, 153 and 154, e.g., a connection line for transferring a transmission signal which substantially or significantly affects display quality of the display panel 400, for example, the display data D_DATA, the low power signals VSS and so on, may be formed to be configured as the vertical line type. Therefore, in such an embodiment, the transmission signal which has a significant influence on the display quality may be effectively prevented from being delayed and skewed.

As described above, in an exemplary embodiment, the connection line part 150 include the connection lines 151, 152, 153 and 154 configured as the vertical line type, and thus a line length of the connection line part 150 may be decreased and a line width of the connection line part 150 may be increased. Therefore, in such an embodiment, the connection line part 150 may have a low resistance such that a transmission signal may be effectively prevented from being delayed and skewed.

In such an embodiment, a number of the second unit pad U2 in the second pad may be differently determined based on a current amount of the transmission signal such that a delay of the transmission signal may be decreased. In one exemplary embodiment, for example, referring to the digital power signal DVSS and the analog power signal AVSS, the number of the second unit pad U2 in the second analog power pad AVP2 which transfers the analog power signal AVSS having relatively larger current amount may be greater than the number of the second unit pad U2 in the second digital power pad DVP2 which transfers the digital power signal DVSS.

In such an embodiment, the number of the second unit pad U2 may be changed or adjusted to allow the connection lines which transfer a same signal to have a substantially equivalent or the same resistance as each other. Thus, in such an embodiment, a delay difference between the same signals transferred through the connection lines may be decreased. A range of deviation of the substantially equivalent resistance may be about zero (0) ohm to about 1 ohm.

As described above, in an exemplary embodiment, the connection line part 150 may have the low resistance and the equivalent resistance, and thus the transmission signal may be effectively prevented from being delayed and skewed. Therefore, the display quality may be improved.

Figure 4:
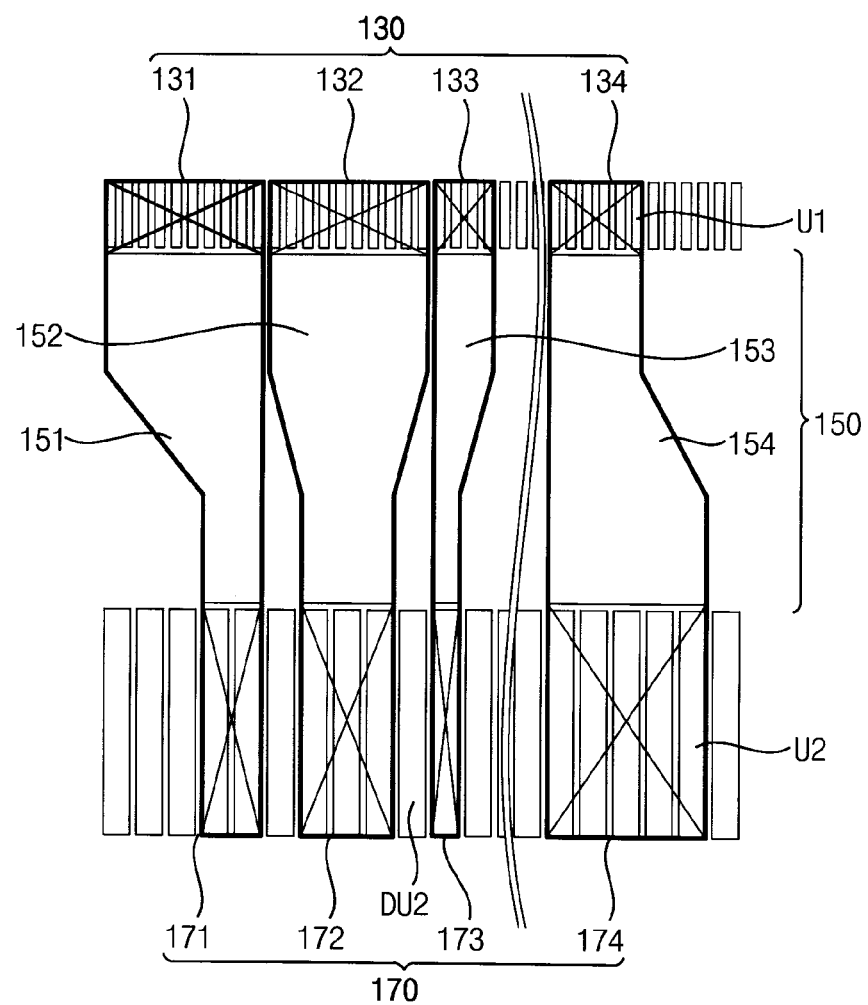
FIG. 4 is a conceptual diagram illustrating an exemplary embodiment of a first pad part, a connection line part and a second pad part disposed in the peripheral area of FIG. 3.

FIG. 4 is a conceptual diagram illustrating an exemplary embodiment of a first pad part, a connection line part and a second pad part disposed in the peripheral area of FIG. 3.

Referring to FIGS. 3 and 4, the first pad part 130 includes a first first digital power pad 131, a first analog power pad 132, a first data pad 133 and a second first digital power pad 134.

The second pad part 170 includes a first second digital power pad 171, a second analog power pad 172, a second data pad 173 and a second second digital power pad 174.

The connection line part 150 includes a plurality of connections lines including a first connection line 151, a second connection line 152, a third connection line 153 and a fourth connection line 154.

The first connection line 151 transfers a digital power signal DVSS and connects the first first digital power pad 131 and the first second digital power pad 171. The second connection line 152 transfers an analog power signal AVSS and connects the first analog power pad 132 and the second analog power pad 172. The third connection line 153 transfers the display data D_DATA and connects the first data pad 133 and the second data pad 173. The fourth connection line 154 transfers the digital power signal DVSS and connects the second first digital power pad 134 and the second second digital power pad 174.

Referring to the first second digital power pad 171 and the second analog power pad 172, the current amount of the digital power signal DVSS is less than the current amount of the analog power signal AVSS. Therefore, the number of the second unit pad U2 allocated for the first second digital power pad 171 may be less than the number of the second unit pad U2 allocated for the second analog power pad 172.

As described above, in an exemplary embodiment, the number of the second unit pad U2 in the second pad may be adjusted based on the current amount of the transmission signal such that the delay of the transmission signal may be decreased.

Referring to the second data pad 173, a dummy unit pad DU2 may be disposed between the second data pad 173 and the second analog power pad 172 in order that the third connection line 153 which is connected to the first data pad 133 has the vertical line type. As shown in FIG. 4, one dummy unit pad DU2 may be disposed between the second data pad 173 and the second analog power pad 172.

As described above, in an exemplary embodiment, the number of the dummy unit pad DU2 between adjacent second pads may be adjusted such that the connection line is configured as the vertical line type.

Referring to the first connection line 151 and the fourth connection line 154, the first connection line 151 and the fourth connection line 154 transfer a same transmission signal, that is, the digital power signal DVSS.

In one exemplary embodiment, for example, as shown in FIG. 4, the first connection line 151 connects the first first digital power pad 131 and the first second digital power pad 171. A first section of the first connection line 151 adjacent to the first first digital power pad 131 has a width thicker than a second section of the first connection line 151 adjacent to the first second digital power pad 171.

However, referring to the fourth connection line 154 transferring the same transmission signal that is the digital power signal DVSS, the fourth connection line 154 connects the second second digital power pad 134 and the second second digital power pad 174. A first section of the fourth connection line 154 adjacent to the second second digital power pad 134 has a width thinner than a second section of the fourth connection line 154 adjacent to the second second digital power pad 174.

In an exemplary embodiment, where the fourth connection line 154 has a resistance equal to the first connection line 151, the second section of the fourth connection line 154 adjacent to the second second digital power pad 174 may have a thick width. Thus, the number of the second unit pad U2 in the second second digital power pad 174 may be increased, and the second section of the fourth connection line 154 adjacent to the second second digital power pad 174 may thereby have the thick width. As described above, the first and fourth connection lines 151 and 154 which transfer the digital power signal DVSS may have the equivalent resistance.

When resistances of the connection lines which transfer the same transmission signal are different, the second pads of the connection lines may respectively include the second unit pads of different numbers from each other in order that the connection lines may have the equivalent resistance. When resistances of the connection lines which transfer the same transmission signal are the same, the second pads of the connection lines may respectively include the second unit pads of a same number in order that the connection lines may have the equivalent resistance.

In an exemplary embodiment, the number of the second unit pad in each of the connection lines which transfer the same transmission signal may be adjusted so that the connection lines may have the equivalent resistance.

Figure 5:
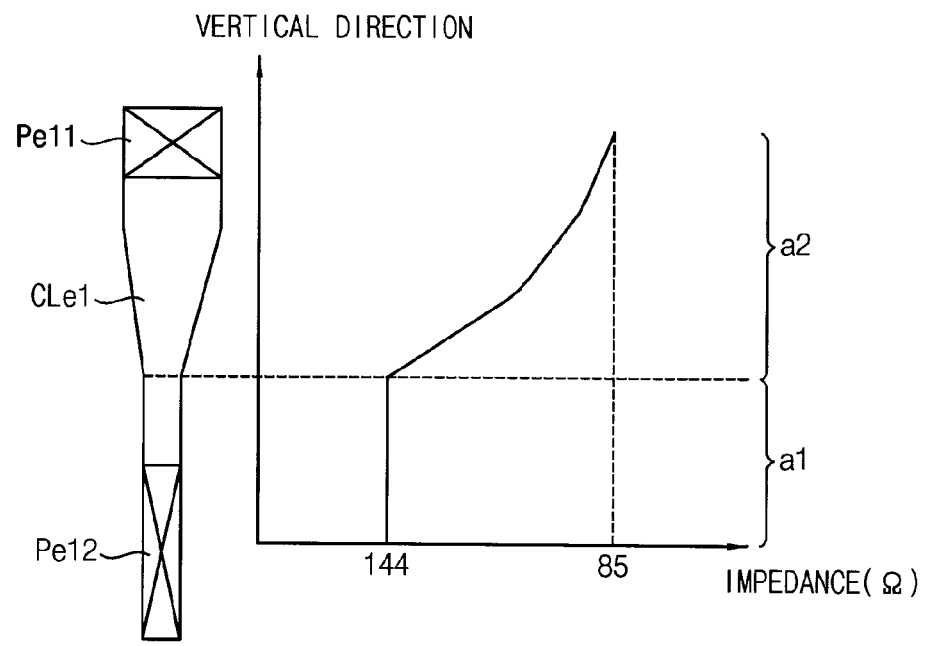
FIG. 5 is a conceptual diagram illustrating an exemplary embodiment of a connection line according to the invention.
Figure 6:
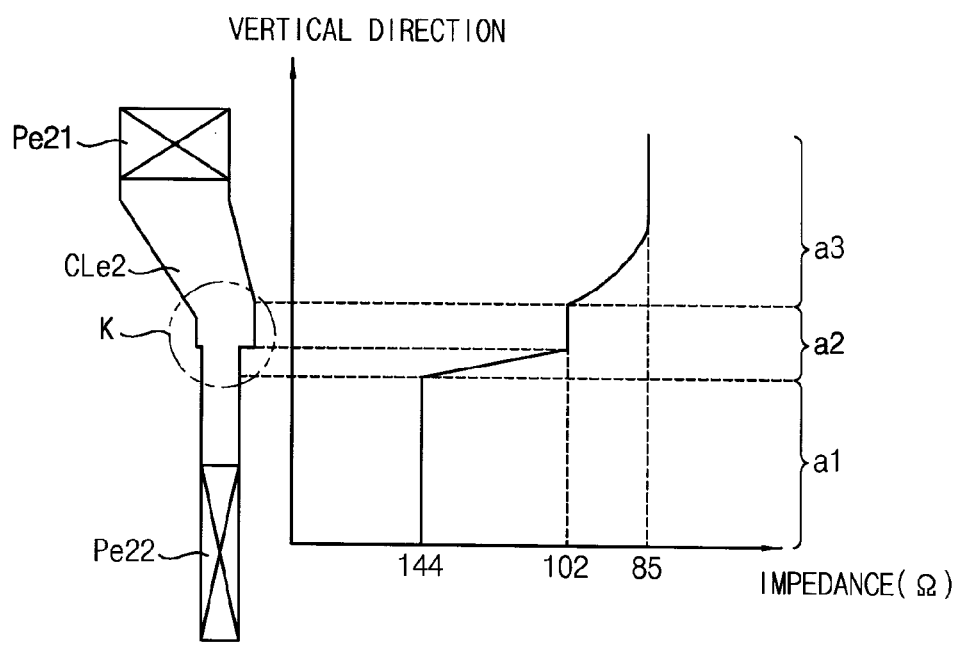
FIG. 6 is a conceptual diagram illustrating an alternative exemplary embodiment of a connection line according to the invention.

FIG. 5 is a conceptual diagram illustrating an exemplary embodiment of a connection line according to the invention. FIG. 6 is a conceptual diagram illustrating an alternative exemplary embodiment of a connection line according to the invention.

Referring to FIG. 5, in an exemplary embodiment, a first connection line CLe1 connects a first pad Pe11 and a second pad Pe12. An edge portion of the first connection line CLe1 is gradually sloped with respect to the extending direction of the first connection line CLe1.

Referring to an impedance of the first connection line CLe1, the impedance of first line area a1 which has a thin width may be about 144 ohm, and the impedance of a second line area a2 which had a gradually increasing width may be gradually decreased to about 85 ohm.

Referring to FIG. 6, in an alternative exemplary embodiment, a second connection line CLe2 connects a first pad Pe21 and a second pad Pe22. The second connection line CLe2 includes a gradual slope section and a projection section K.

Referring to an impedance of the second connection line CLe2, the impedance of first line area a1 which has a thin width is about 144 ohm, the impedance of a second line area a2 corresponding to the projection section K in which a width is suddenly increased, is about 102 ohm and the impedance of a third line area a3 which had a gradually increasing width is gradually decreased to about 85 ohm.

In an exemplary embodiment, referring to the first connection line CLe1 and the second connection line CLe2 as shown in FIGS. 5 and 6, impedances of the first and second connection lines CLe1 and CLe2 are similar to each other. However, the second connection line CLe2 has the projection section K which has the impedance suddenly increased. An inflection point as the projection section K may occur a noise. Thus, the first connection line CLe1 having a gradual slope section may decrease the noise in comparison with the second connection line CLe2 having the projection section K.

Figure 7:
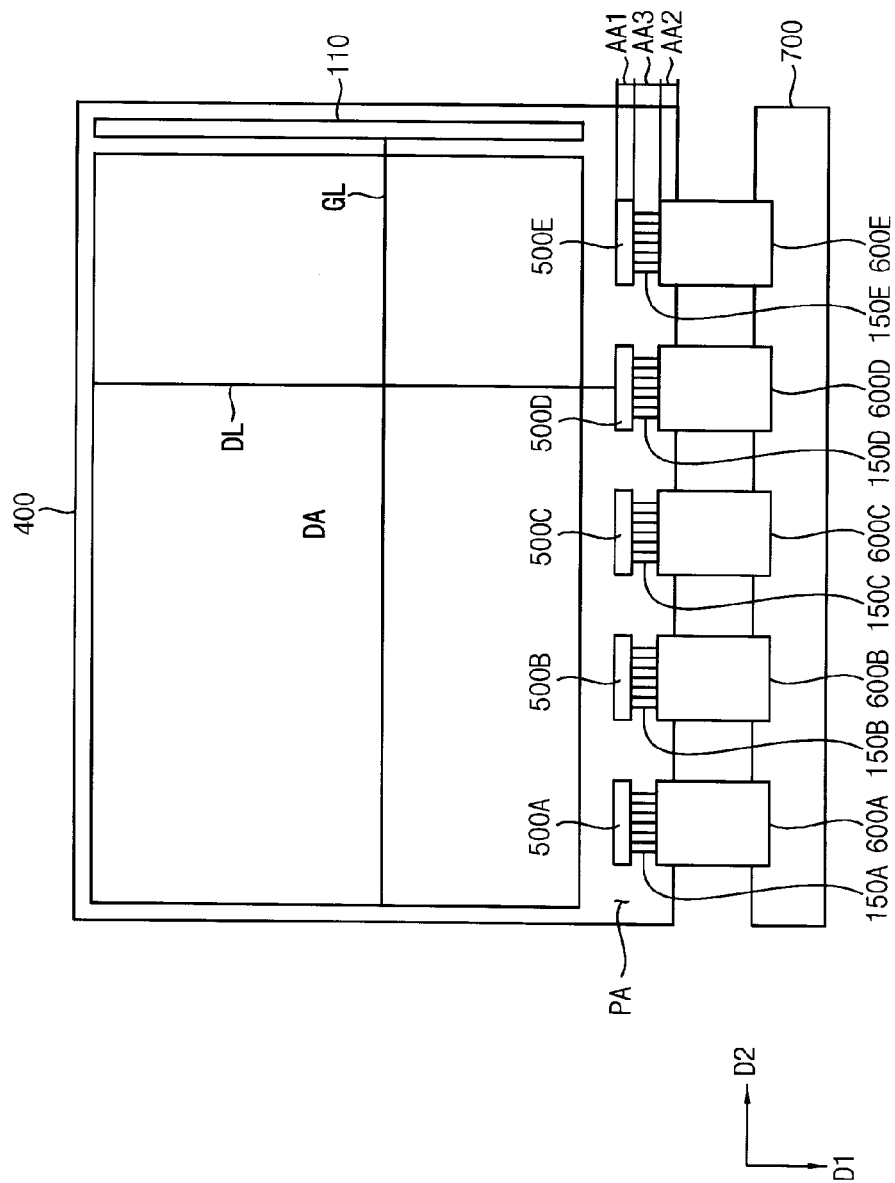
FIG. 7 is a plan view illustrating an alternative exemplary embodiment of a display apparatus according to the invention.

FIG. 7 is a plan view illustrating an alternative exemplary embodiment of a display apparatus according to the invention.

The plan view of the display apparatus in FIG. 7 is substantially the same as the plan view of the display apparatus shown in FIG. 1 except for the connection line part 150, the driver circuit 500 and the flexible circuit film 600. The same or like elements shown in FIG. 7 have been labeled with the same reference characters as used above to describe the exemplary embodiments of the display apparatus shown in FIG. 1, and any repetitive detailed description thereof will hereinafter be omitted or simplified.

Referring to FIG. 7, the display apparatus includes a display panel 400, a plurality of driver circuits 500A to 500E, a plurality of flexible circuit films 600A to 600E and a printed circuit board 700.

The display panel 400 includes a display area DA and a peripheral area PA which surrounds the display area DA.

A plurality of pixels P is disposed in the display area DA.

The driver circuits 500A to 500E, the flexible circuit films 600A to 600E, a plurality of connection line parts 150A to 150D which connects the driver circuits 500A to 500E and the flexible circuit films 600A to 600E, and a gate driver circuit 110 are disposed in the peripheral area PA.

The driver circuits 500A to 500E are disposed in a first area AA1 adjacent to an end portion of the data line DL. The driver circuits 500A to 500E provide a plurality of data lines DL with a plurality of data voltages.

The flexible circuit films 600A to 600E are disposed in a second area AA2 which is spaced apart from the first area AA1 in the first direction D1.

The connection line parts 150A to 150D are disposed in a third area AA3 between the first area AA1 and the second area AA2. Each of the connection line parts includes a plurality of connection lines.

In an exemplary embodiment, each of the connection line parts 150A to 150D is configured as the vertical line type, which is substantially the same as the connection line part 150 described above.

In an exemplary embodiment, the connection line part, which connects the first pad part electrically connected to the input bump of the driver circuit through the ACF and the second pad part electrically connected to the output bump of the flexible circuit film through the ACF, may be configured as the vertical line type as described above, and any repetitive detailed description thereof will be omitted.

According to exemplary embodiments of the invention as set forth herein, the connection line part is configured as the vertical line type, and thus a line length of the connection line part may be decreased and a line width of the connection line part may be increased. Therefore, the connection line part may have a low resistance. In such embodiments, the number of the second unit pad in the second pad may be adjusted based on the current amount of the transmission signal thereof such that the delay of the transmission signal may be decreased. In such embodiments, the number of the second unit pad U2 may be adjusted so that the connection line for transferring the same transmission signal may have a substantially equivalent resistance. Thus, a delay difference between same transmission signals transferred through the connection lines may be decreased. Therefore, signal integrity and display quality of the display apparatus may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
a pixel electrode disposed in a display area;
a first pad part disposed in a first area of a peripheral area, which is disposed adjacent to the display area, wherein the first pad part is electrically connected to a driver circuit;
a second pad part disposed in a second area of the peripheral area facing the first pad part, wherein the second pad part is electrically connected to a flexible circuit film which transfers a transmission signal to the driver circuit; and
a connection line part disposed in a vertical spacing area defined between the first and second pad parts as a vertical line type, wherein the connection line part connects the first and second pad parts to each other.

2. The display substrate of claim 1, wherein
the first pad part comprises a plurality of first pads,
each of the first pads comprises a first unit pad,
an input bump of the driver circuit is electrically connected to the first unit pad,
the second pad part comprises a plurality of second pads,
each of the second pads comprises a second unit pad, and
an output bump of the flexible circuit film is electrically connected to the second unit pad.

3. The display substrate of claim 2, wherein
first unit pads of the first pads are arranged at a regular distance from each other and have a size substantially the same as each other,
second unit pads of the second pads are arranged at a regular distance from each other and have a size substantially the same as each other, and
the regular distance and the size of the second unit pads of the second pads are greater than the regular distance and the size of the first unit pads of the first pads, respectively.

4. The display substrate of claim 2, wherein the connection line part comprises a plurality of connection lines which connects the first pads and the second pads and is configured as the vertical line type.

5. The display substrate of claim 4, wherein
each of the connection lines connects a first pad among the first pads and a second pad among the second pads corresponding to each other, and
the second unit pad of the second pad is disposed on a vertical line from the first unit pad of the first pad connected to the second pad.

6. The display substrate of claim 5, wherein the second pad part further comprises a dummy unit pad which is disposed between the second pads and is electrically floated.

7. The display substrate of claim 4, wherein
a number of the second unit pad in a second pad of the second pads is determined by a current amount of the transmission signal applied to the second pad, and
when the current amount of the transmission signal applied to the second pad is increased, the number of the second unit pad in the second pad is increased.

8. The display substrate of claim 4, wherein
the connection lines which transfer a same transmission signal have different resistances from each other, and
numbers of the second unit pad in the second pads connected to the connection lines which transfer a same transmission signal are different from each other.

9. The display substrate of claim 4, wherein
the connection lines which transfer a same transmission signal have a substantially same resistance, and
numbers of the second unit pad in the second pads connected to the connection lines which transfer a same transmission signal are the same as each other.

10. The display substrate of claim 4, wherein a connection line configured to transfer a reference power signal for driving the pixel electrode among the connection lines is configured as the vertical line type.

11. The display substrate of claim 10, wherein a connection line configured to transfer an image data signal for driving the pixel electrode among the connection lines is configured as the vertical line type.

12. The display substrate of claim 4, wherein the connection lines have an edge portion which is gradually sloped.

13. A display apparatus comprises:
a display panel comprising a display area, a peripheral area which surrounds the display area and a plurality of pixels disposed in the display area;
a driver circuit connected to a first pad part of the display panel, which is disposed in a first area of the peripheral area, through an anisotropic conductive film, wherein the driver circuit is configured to provide the pixels with data voltages;
a flexible circuit film connected to a second pad part of the display panel, which is disposed in a second area facing the first area of the peripheral area, through the anisotropic conductive film, wherein the flexible circuit film is configured to transfer a transmission signal to the driver circuit; and
a connection line part disposed in an area between the first and second pad parts as a vertical line type, wherein the connection line connects the first and second pad parts to each other.

14. The display apparatus of claim 13, wherein a number of the driver circuit connected to the first pad part is equal to or greater than two.

15. The display apparatus of claim 13, wherein
the first pad part comprises a plurality of first pads,
each of the first pads comprises a first unit pad,
an input bump of the driver circuit is electrically connected to the first unit pad,
the second pad part comprises a plurality of second pads,
each of the second pads comprises a second unit pad,
an output bump of the flexible circuit film is electrically connected to the second unit pad, and the connection line part comprises a plurality of connection lines which connects the first and second pads.

16. The display apparatus of claim 15, wherein the second pad part further comprises a dummy unit pad which is disposed between the second pads and is electrically floated.

17. The display apparatus of claim 15, wherein
a number of the second unit pad in a second pad of the second pads is determined by a current amount of the transmission signal applied to the second pad, and
when the current amount of the transmission signal applied to the second pad is increased, the number of the second unit pad in the second pad is increased.

18. The display apparatus of claim 15, wherein
the connection lines which transfer a same transmission signal have a substantially same resistance, and
numbers of the second unit pad in the second pads connected to the connection lines which transfer the same transmission signal are the same as each other.

19. The display apparatus of claim 15, wherein a connection line configured to transfer a reference power signal for driving the pixels among the connection lines is configured as the vertical line type.

20. The display apparatus of claim 19, wherein a connection line configured to transfer an image data signal for driving the pixels among the connection lines is configured as the vertical line type.

* * * * *